(12) United States Patent
Bernt et al.

(10) Patent No.: US 11,203,816 B1
(45) Date of Patent: Dec. 21, 2021

(54) ELECTROPLATING SEED LAYER BUILDUP AND REPAIR

(71) Applicant: Applied Materials, Inc., Santa Clara, CA (US)

(72) Inventors: Marvin L. Bernt, Whitefish, MT (US); James C. Burnham, Kalispell, MT (US); Robert Mikkola, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/079,127

(22) Filed: Oct. 23, 2020

(51) Int. Cl.
*C25D 5/18* (2006.01)
*C25D 7/12* (2006.01)
*H01L 21/768* (2006.01)
*H01L 21/288* (2006.01)

(52) U.S. Cl.
CPC ............... *C25D 5/18* (2013.01); *C25D 7/123* (2013.01); *H01L 21/2885* (2013.01); *H01L 21/76843* (2013.01); *H01L 21/76879* (2013.01)

(58) Field of Classification Search
CPC ................... C25D 5/18; C25D 17/001
See application file for complete search history.

(56) References Cited

U.S. PATENT DOCUMENTS

| | | | | |
|---|---|---|---|---|
| 5,972,192 A | * | 10/1999 | Dubin | C25D 3/38 205/101 |
| 2010/0300888 A1 | * | 12/2010 | Ponnuswamy | C25D 3/38 205/157 |

* cited by examiner

*Primary Examiner* — Brian W Cohen
(74) *Attorney, Agent, or Firm* — Kilpatrick Townsend & Stockton LLP

(57) ABSTRACT

Exemplary methods of electroplating may include delivering a current from a power supply through a plating bath of an electroplating chamber for a first period of time. The current delivered may be or include a pulsed current at a duty cycle of less than or about 50%. The methods may include plating a first amount of metal on a substrate within the plating bath. The substrate may define a via within the substrate. The methods may include, subsequent the first period of time, transitioning the power supply to a continuous DC current delivery for a second period of time. The methods may include plating a second amount of metal on the substrate.

19 Claims, 4 Drawing Sheets

ELECTROPLATING SEED LAYER BUILDUP AND REPAIR

TECHNICAL FIELD

The present technology relates to electroplating operations in semiconductor processing. More specifically, the present technology relates to systems and methods that perform seed layer buildup in electroplating systems.

BACKGROUND

Integrated circuits are made possible by processes which produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may create expensive waste substrates or wafers.

Electroplating is performed in an electroplating chamber with the target side of the wafer in a bath of liquid electrolyte, and with electrical contacts on a contact ring touching a conductive layer, such as a seed layer, on the wafer surface. Electrical current is passed through the electrolyte and the conductive layer from a power supply. Metal ions in the electrolyte plate out onto the wafer, creating a metal layer on the wafer. When the wafer has non-planar features defined across the surface, the seed layer may be incomplete, or characterized by variable thickness along the features of the wafer. These variations can challenge electroplating operations, which benefit from a seed layer of uniform thickness and sufficient conductivity. Plating onto seed layers with thin or missing metal may cause voids or non-uniform plated layers.

Thus, there is a need for improved systems and methods that can be used to produce high quality devices and structures. These and other needs are addressed by the present technology.

SUMMARY

Exemplary methods of electroplating may include delivering a current from a power supply through a plating bath of an electroplating chamber for a first period of time. The current delivered may be or include a pulsed current at a duty cycle of less than or about 50%. The methods may include plating a first amount of metal on a substrate within the plating bath. The substrate may define a via within the substrate. The methods may include, subsequent the first period of time, transitioning the power supply to a continuous DC current delivery for a second period of time. The methods may include plating a second amount of metal on the substrate.

In some embodiments, the current delivered during the first period of time is characterized by an operational frequency of less than or about 1,000 Hz. An average current density during the first period of time may be less than or about 3 mA/cm$^2$. An average current density during the second period of time may be greater than or equal to the average current density during the first period of time. A peak current during the second period of time may be less than or about 2 Amps. A peak current during the first period of time may be greater than or about 2 Amps. During the second period of time, average current density may be increased over time. The via defined within the substrate may be characterized by a depth of greater than or about 10 μm. A barrier layer may be formed along walls of the via defined within the substrate. The barrier layer may be or include one or more of tantalum or titanium, and the metal deposited may be or include copper.

Some embodiments of the present technology may encompass methods of electroplating. The methods may include delivering a current from a power supply through a plating bath of an electroplating chamber for a first period of time. The power supply may be operated during the first period of time in a pulsed DC delivery at a frequency of less than or about 750 Hz. The methods may include plating a first amount of copper on a substrate within the plating bath. The methods may include, subsequent the first period of time, transitioning the power supply to a continuous DC current delivery for a second period of time. The methods may include plating a second amount of copper on the substrate.

In some embodiments, an on-time during the first period of time for each pulse may be less than or about 100 ms. During the first period of time, the power supply may be operated at a duty cycle of less than or about 20%. An average current density during the first period of time may be less than an average current density during the second period of time. A peak current density during the first period of time may be greater than a peak current density during the second period of time. The peak current density during the first period of time may be greater than or about two times the peak current density during the second period of time. The substrate may define a via characterized by a depth-to-width ratio greater than or about 10. The via may be lined with a barrier layer and a seed layer of copper. During the second period of time, average current density may be ramped in a set of plating operations.

Some embodiments of the present technology may encompass methods of electroplating. The methods may include delivering a current from a power supply through a plating bath of an electroplating chamber for a first period of time. The power supply may be operated during the first period of time in a pulsed DC delivery at a frequency of less than or about 1000 Hz at a duty cycle of less than or about 50%. The methods may include plating a first amount of copper on a substrate within the plating bath. The substrate may define a via lined with a barrier layer and a seed layer of copper. The first amount of copper plated may be characterized by a thickness of less than or about 500 nm. Subsequent the first period of time, the methods may include transitioning the power supply to a continuous DC current delivery for a second period of time greater than the first period of time. An average current density during the second period of time may be greater than an average current density during the first period of time. The methods may include plating a second amount of copper on the substrate.

Such technology may provide numerous benefits over conventional technology. For example, the present technology may increase seed layer coverage prior to electroplating operations, which may increase uniformity of plating. Additionally, the present technology may be performed in the plating chamber in which the electroplating may be performed, which may increase throughput compared to other technologies that attempt seed layer repair in a separate processing chamber. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
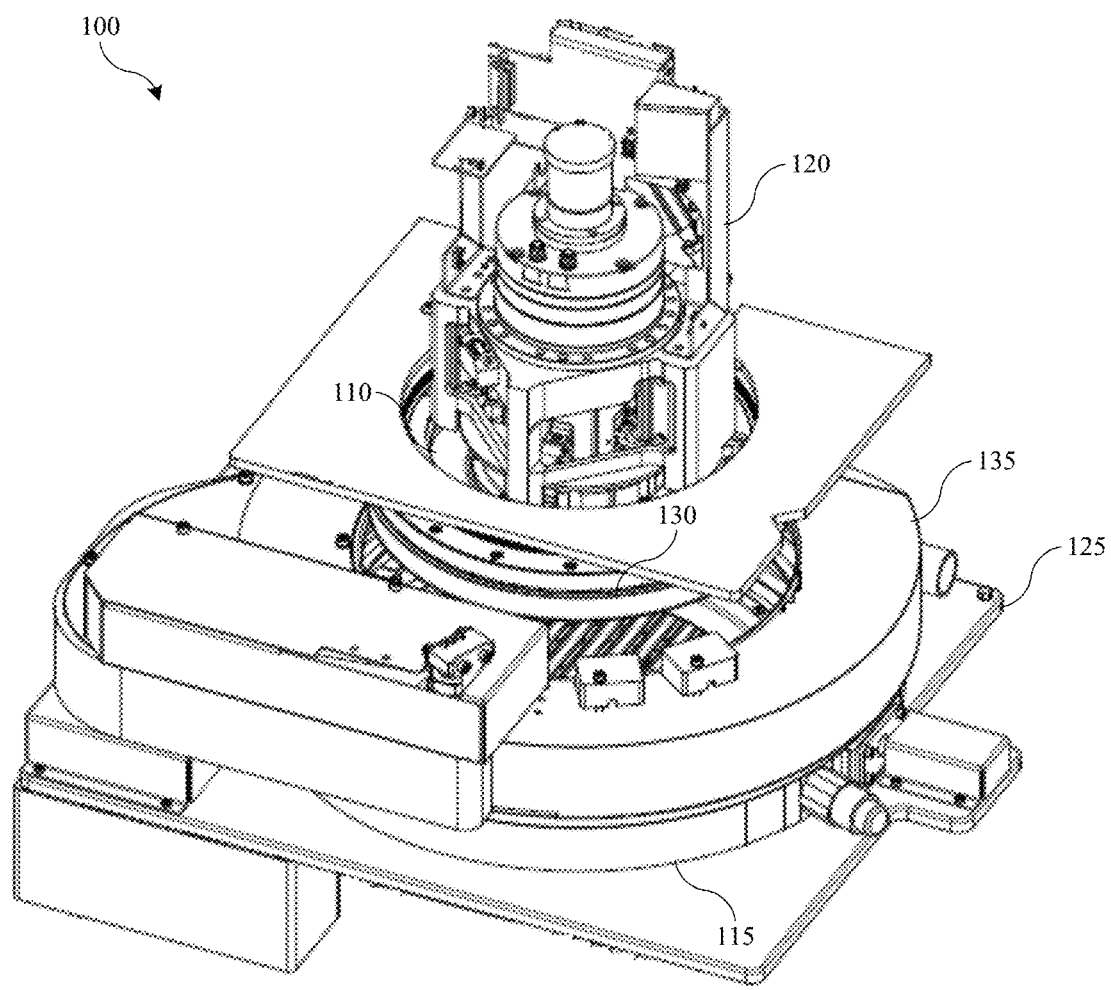
FIG. 1 shows a schematic perspective view of an electroplating system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Various operations in semiconductor manufacturing and processing are performed to produce vast arrays of features across a substrate. As layers of semiconductors are formed, vias, trenches, and other pathways are produced within the structure. These features may then be filled with a conductive or metal material that allows current to conduct through the device from layer to layer.

Electroplating operations may be performed to provide conductive material into vias and other features on a substrate. Electroplating utilizes an electrolyte bath containing ions of the conductive material to electrochemically deposit the conductive material onto the substrate and into the features defined on the substrate. The substrate on which metal is being plated operates as the cathode. An electrical contact, such as a ring or pins, may allow the current to flow through the system. During electroplating, a substrate may be clamped to a head and submerged in the electroplating bath to form the metallization. In systems as described below, the substrate may also be chucked within a seal that may be coupled with the head during processing.

The substrate provided may include a barrier layer formed along the features, such as along sidewalls and a base of vias, and may include a seed layer of metal. The seed layer may provide a conductive path to promote nucleation for metal ions to plate out of the solution. Forming a seed layer may occur by physical-vapor deposition, which may be plasma-enhanced or otherwise performed, and which may at least partially rely on line-of-sight access within the feature. For example, when vias are formed within the substrate and are characterized by a high aspect ratio, forming a conformal seed layer may be challenged, especially in lower sidewall and corner areas of the feature. This region may then be characterized by a much thinner seed layer coverage, if not exposed barrier layer. During subsequent electroplating, these regions may insufficiently conduct current at plating current densities, and voids may form in the feature, which may increase impedance or fail to produce a conductive path through the feature.

Conventional technologies have struggled to repair the seed layer in high-aspect-ratio features. For example, the seed layer may be formed to a greater thickness during the physical vapor deposition in an attempt to ensure continuous coverage along the sidewalls. However, as coverage across the neck of the features and top surface of the wafer increases, the feature may be pinched off, or may have limited access for plating fluid, which may further limit plating. Conventional repair technology may attempt to perform a current-free process in an attempt to create a favorable surface condition in regions along the feature to form deposition. However, these processes typically require an additional processing chamber to perform the repair, and because adhesion of material may be poor, may require a subsequent anneal operation prior to electroplating. This may further reduce throughput, if the repair may even be performed.

The present technology overcomes these issues by incorporating a seed layer buildup or repair within the electroplating chamber in a process operation that may occur prior to the electroplating. The system may utilize high-power pulsing to overcome conductivity limitations across the surfaces of the substrate features, which may produce a sufficient seed layer thickness in all regions of the substrate. Subsequent plating may then be performed to fill the feature uniformly as current densities may be more uniform across the feature surfaces. After describing an exemplary chamber system in which embodiments of the present technology may be performed, the remaining disclosure will discuss aspects of the systems and processes of the present technology.

FIG. 1 shows a schematic perspective view of an electroplating system 100 for which methods and cleaning systems may be utilized and practiced according to embodiments of the present technology. Electroplating system 100 illustrates an exemplary electroplating system including a system head 110 and a bowl 115. During electroplating operations, a wafer may be clamped to the system head 110, inverted, and extended into bowl 115 to perform an electroplating operation. Electroplating system 100 may include a head lifter 120, which may be configured to both raise and rotate the head 115, or otherwise position the head within the system including tilting operations. The head and bowl may be attached to a deck plate 125 or other structure that may be part of a larger system incorporating multiple electroplating systems 100, and which may share electrolyte and other materials. A rotor may allow a substrate clamped to the head to be rotated within the bowl, or outside the bowl in different operations. The rotor may include a contact ring, which may provide the conductive contact with the substrate. A seal 130 discussed further below may be connected with the head. Seal 130 may include a chucked wafer to be processed. FIG. 1 illustrates an electroplating chamber that may include components to be cleaned directly on the platform. Although it is to be understood that other configurations are possible, including platforms on which the head is moved to an additional module and seal or other component cleaning is performed, an exemplary in situ rinse system 135 is also illustrated with the system 100.

Figure 2:
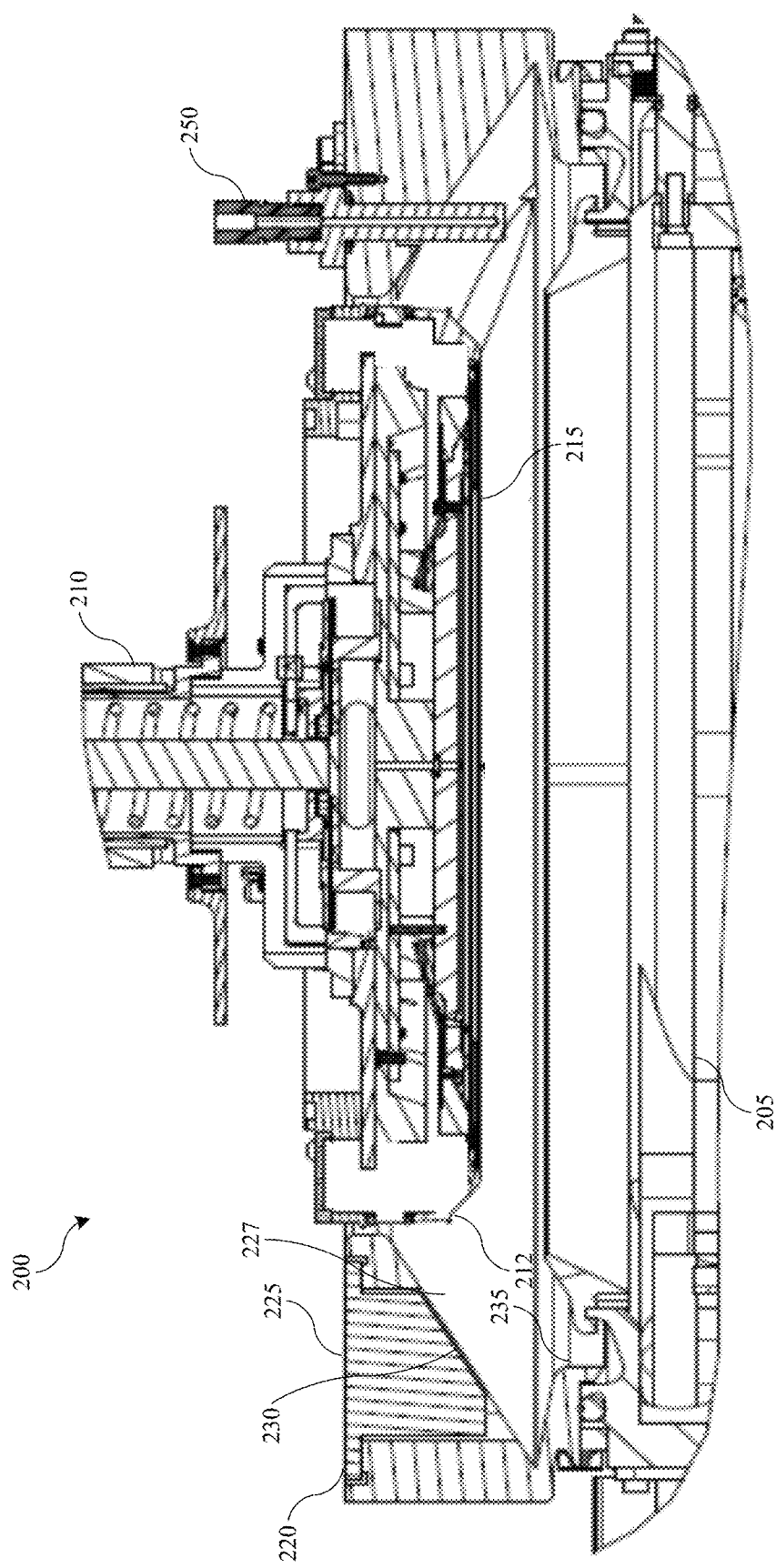
FIG. 2 shows a partial cross-sectional view of an electroplating system according to some embodiments of the present technology.

Turning to FIG. 2 is shown a partial cross-sectional view of a chamber including aspects of an electroplating apparatus 200 according to some embodiments of the present technology. The electroplating apparatus 200 may be incorporated with an electroplating system, including system 20 described above. As illustrated in FIG. 2, a plating bath 205 of an electroplating system is shown along with a head 210 having a substrate 215 coupled with the head. The substrate may be coupled with a seal 212 incorporated on the head in some embodiments. A rinsing frame 220 may be coupled above the plating bath vessel 205, and may be configured to receive the head into the vessel during plating. Rinsing frame 220 may include a rim 225 extending circumferentially about an upper surface of the plating bath vessel 205. A rinsing channel 227 may be defined between the rim 225 and an upper surface of the plating bath vessel 205. For example, rim 225 may include interior sidewalls 230 characterized by a sloping profile. As described above, rinse fluid slung off a substrate may contact the sidewalls 230, and may be received in a plenum 235 extending about the rim for collection of the rinse fluid from the electroplating apparatus 200.

Electroplating apparatus 200 may additionally include one or more cleaning components in some embodiments. The components may include one or more nozzles used to deliver fluids to or towards the substrate 215 or the head 210. FIG. 2 illustrates one of a variety of embodiments in which improved rinse assemblies may be used to protect the bath and substrate during rinsing operations. A side clean nozzle 250 may extend through the rim 225 of the rinsing frame 220 in some embodiments and be directed to rinse seal 212, along with aspects of substrate 215.

Figure 3:
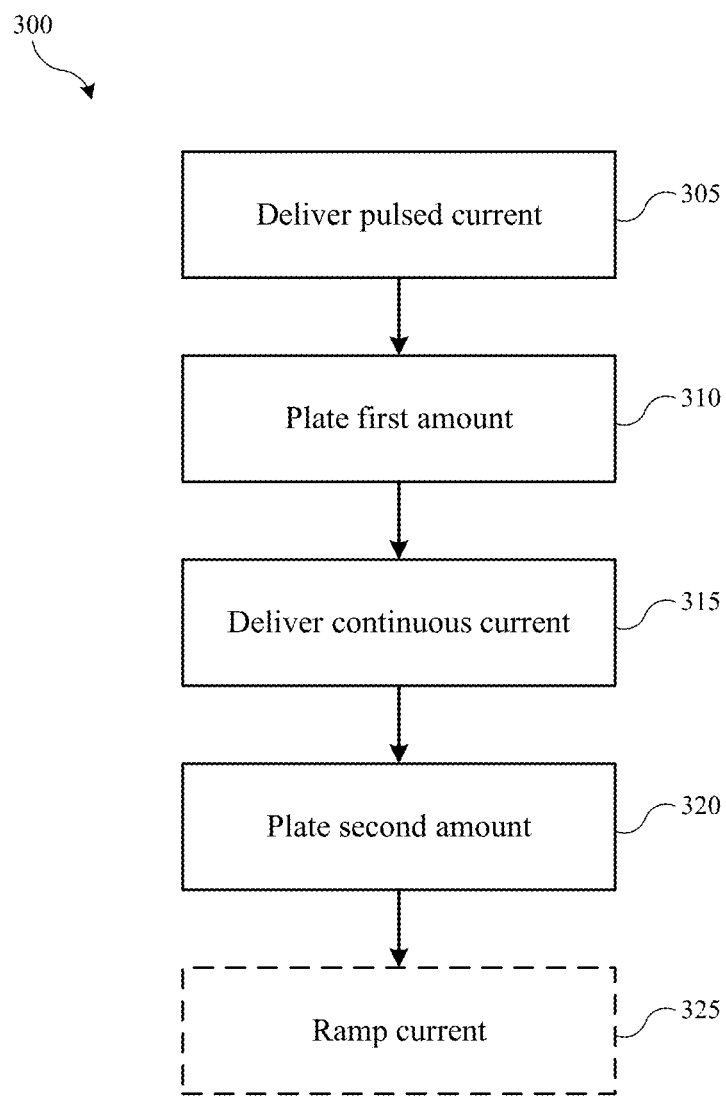
FIG. 3 shows exemplary operations in a method of electroplating according to some embodiments of the present technology.

The chamber or systems discussed previously may be used in performing exemplary methods including electroplating methods. Turning to FIG. 3 is shown exemplary operations in a method 300 according to embodiments of the present technology. Method 300 may include one or more operations prior to the initiation of the method, including front end processing, deposition, gate formation, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the processes performed, but are not critical to the technology, or may be performed by alternative methodology as will be discussed further below. Method 300 may describe operations shown schematically in FIGS. 4A-4B, the illustrations of which will be described in conjunction with the operations of method 300. It is to be understood that the figures illustrate only partial schematic views, and a substrate may contain any number of additional materials and features having a variety of characteristics and aspects as illustrated in the figures.

Figure 4A:
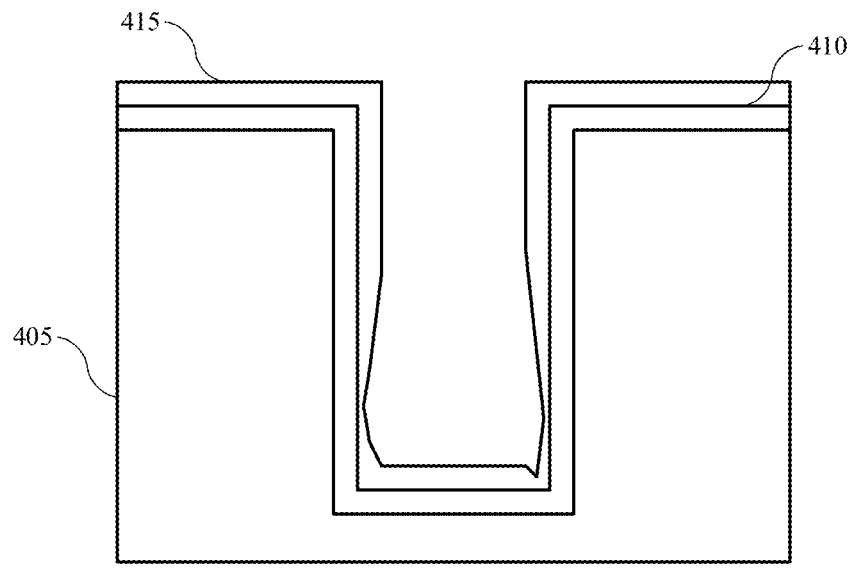
FIGS. 4A-4B show schematic cross-sectional views of a substrate during seed layer buildup according to some embodiments of the present technology.

Method 300 may or may not involve optional operations to develop the semiconductor structure to a particular fabrication operation. It is to be understood that method 300 may be performed on any number of semiconductor structures or substrates 405, as illustrated in FIG. 4A, including exemplary structures on which electroplating operations may be performed. Exemplary semiconductor structures may include a trench, via, or other recessed features that may include one or more materials. For example, an exemplary substrate may contain silicon, silicon oxide, or some other semiconductor substrate material as well as interlayer dielectric materials through which a recess, trench, via, or isolation structure may be formed. In some embodiments exemplary substrates may include a barrier layer 410, such as tantalum, tantalum nitride, titanium, or any other barrier material including any refractory material, which may limit diffusion or interaction of a fill material with the underlying substrate. The barrier layer may also facilitate deposition of a seed layer 415 in some embodiments, and the barrier layer may also be or include an adhesion layer to facilitate formation of the seed layer. Seed layer 415 may include any metal or conductive material, such as copper. Although the remaining disclosure will discuss copper electroplating operations, it is to be understood that additional materials may also be plated utilizing embodiments of the present technology.

As explained previously, seed layer 415 may be formed by physical vapor deposition, and the process performed may provide limited coverage along certain regions of the via, such as the bottom corner or sidewall proximate the base of the trench. Although the deposition may be performed for a longer period of time, this may cause pinch-off at the top of the trench, challenging electrodeposition, if not preventing access into the trench for electroplating fluid. It is to be understood that the noted structure is not intended to be limiting, and any of a variety of other semiconductor structures including seed layer materials are similarly encompassed. Other exemplary structures may include two-dimensional and three-dimensional structures common in semiconductor manufacturing, and within which a via or feature may be formed, and along which a seed layer may be deposited, as the present technology may buildup or repair seed layers in any number of structures. Additionally, although a high-aspect-ratio structure may benefit from the present technology, the technology may be equally applicable to lower aspect ratios and any other structures.

For example, features according to the present technology may be characterized by any aspect ratios or the depth-to-width ratio of the structure, although in some embodiments the materials may be characterized by larger aspect ratios, which may challenge sufficient seed layer coverage throughout the feature. For example, in some embodiments the aspect ratio of any via or feature of an exemplary structure may be greater than or about 10:1, greater than or about 20:1, greater than or about 30:1, greater than or about 40:1, greater than or about 50:1, or greater. Additionally, each feature may be characterized by a reduced width or diameter at a neck or opening of the feature, such as less than or about 10 µm, less than or about 8 µm, less than or about 6 µm, less than or about 5 µm, less than or about 4 µm, less than or about 3 µm, less than or about 2 µm, less than or about 1 µm, or less. This combination of high aspect ratios and minimal width may frustrate many conventional seed layer deposition operations, which may lead to void formation or incomplete fill in subsequent electroplating operations. By utilizing processes according to embodiments of the present technology, seed layers along features of virtually any aspect ratio may be built up or repaired prior to performing additional electroplating operations.

Method 300 may be performed in an electroplating system as previously described, which may include a substrate having already been processed to a particular degree. For example, prior to submerging the features of the substrate into a plating bath, any number of processing operations may be performed to produce any number of semiconductor structures. A via, such as a through-silicon via or any other high-aspect-ratio feature may be formed through the substrate. A liner, such as liner 410 may be formed along the feature, and may be formed conformally utilizing any number of processes or technologies. A seed layer 415 may be formed, which may be characterized by incomplete or non-uniform coverage across the surfaces of the feature as illustrated. It is to be understood that the figures are included for illustration only, and are not to be considered of any particular scale. For example, gaps may occur in coverage of the seed layer, or a minimal thickness may be developed in certain regions, which may be characterized by a thickness of a few dozen Angstrom or less. If left untreated, these minimal coverage regions may develop voids in the fill process.

The present technology may perform seed layer buildup or repair in the electroplating chamber itself. After wetting, such as a vacuum pre-wet, has been performed across the features of the substrate, the substrate may be clamped within an electroplating system as previously described, and disposed within a plating bath. The plating bath may be an acid bath that may include copper or other metal ions for plating, and may include any number of additional materials within the bath. For example, levelers, suppressors, accelerators, or any other materials may be included within the plating bath to facilitate plating operations. The methods may include an optional dwell within the plating bath prior to performing noted operations of method 300, which may allow diffusion of bath materials within the features. As explained above, attempting to increase the seed layer with additional physical vapor deposition may cause the neck of the feature to be pinched off due to the continued deposition. However, the present technology may leverage the accelerators and suppressors within the plating bath during the methods performed. As the lower-mobility suppressors may limit plating along the outer surface of the substrate and the neck of the feature, the higher-mobility accelerators may fully penetrate the feature to facilitate the repair. Accordingly, the present technology may not be limited by line-of-sight formation or pinch-off issues similar to continued physical vapor deposition.

Typical electroplating may be performed with DC current applied at a particular average current density. The average current density may be maintained relatively low, such as less than or about 3.0 mA/cm$^2$, less than or about 2.5 mA/cm$^2$, less than or about 2.0 mA/cm$^2$, less than or about 1.5 mA/cm$^2$, less than or about 1.0 mA/cm$^2$, less than or about 0.5 mA/cm$^2$, or less. By maintaining a low current density, plating growth may be controlled to limit or prevent formation of dendrites, and ensure the additives may be functioning within a nominal current window. Because a direct current may be utilized, peak current may be substantially equal to or less than the average current density. However, this low current process may provide insufficient conductivity along regions of low seed coverage, which may cause several issues. For example, the plating may not occur at these regions, and additionally, current may be non-uniformly distributed to adjacent regions, which may impact additive functionality as well as plating in these regions. This may produce voids, which may increase and close off during continued plating. The present technology may perform a repair process that may overcome the conductivity limitations associated with insufficient seed layer coverage.

At operation 305, an electroplating operation may be performed by pulsing a DC power supply delivering pulsed current to the processing chamber and plating bath. Accordingly, the power supply may be operated without pulse reverse, and thus operated in a forward direction throughout the operation, which may ensure only plating and not de-plating occurs. The pulsing may occur at a frequency and duty cycle to increase peak current density during on-times of the power supply. While operating a continuous DC power supply at higher power may cause non-uniform plating that leads to dendritic growth, the present technology may limit the high-power operation to produce an initiation condition that may overcome lower conductivity regions caused by low seed layer coverage or gaps. This may be performed by utilizing an average current density that is maintained similar to or lower than standard electroplating operations.

For example, the DC power supply may be pulsed at a pulsing frequency of greater than or about 1 Hz, and may be pulsed at a frequency of greater than or about 10 Hz, greater than or about 50 Hz, greater than or about 100 Hz, greater than or about 250 Hz, greater than or about 500 Hz, greater than or about 750 Hz, greater than or about 1000 Hz, or higher. However, as pulsing frequency increases, the plating operation may more closely mimic continuous DC power operation, which may over-plate during each on-time operation, and which may cause dendrite formation. Accordingly, in some embodiments the power supply may be pulsed at less than or about 1000 Hz, and may be pulsed at less than or about 900 Hz, less than or about 800 Hz, less than or about 700 Hz, or less. Additionally, the duty cycle may be adjusted to reduce the on-time of the power supply. For example, in some embodiments the duty cycle may be maintained at greater than or about 10%, and may be maintained at greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, greater than or about 65%, greater than or about 70%, greater than or about 75%, or higher. Again, as the duty cycle increases and the power supply more closely mimics continuous DC operation, the ions adjacent the seed layer may plate out quickly causing dendrite formation. Accordingly, in some embodiments the duty cycle may be maintained at less than or about 80%, and may be maintained at less than or about 70%, less than or about 60%, less than or about 50%, or less.

By operating the power supply in a pulsed condition at low duty cycle, a peak current density may be increased, while maintaining an average current density low enough to control plating from the bath. For example, during operation 305 the average current density may be maintained at less than or about 2.0 mA/cm$^2$, and may be maintained at less than or about 1.5 mA/cm$^2$, less than or about 1.0 mA/cm$^2$, less than or about 0.5 mA/cm$^2$, or less. However, peak current during on-time operation may be greater than or about 0.5 A, and may be greater than or about 1.0 A, greater than or about 1.5 A, greater than or about 2.0 A, greater than or about 2.5 A, greater than or about 3.0 A, greater than or about 3.5 A, greater than or about 4.0 A, greater than or about 4.5 A, greater than or about 5.0 Å, or higher. Additionally, peak current density may be greater than or about 2 mA/cm$^2$, and may be greater than or about 5 mA/cm$^2$, greater than or about 10 mA/cm$^2$, greater than or about 20 mA/cm$^2$, greater than or about 50 mA/cm$^2$, or higher. While this high density may cause issues during continuous power operations as explained above, in some embodiments of the present technology, the on-time may be maintained at less than or about 500 ms, and may be maintained at less than or about 250 ms, less than or about 100 ms, less than or about 50 ms, less than or about 25 ms, less than or about 10 ms, less than or about 5 ms, less than or about 1 ms, or less, which may ensure controlled plating occurs without dendritic growth.

Figure 4B:
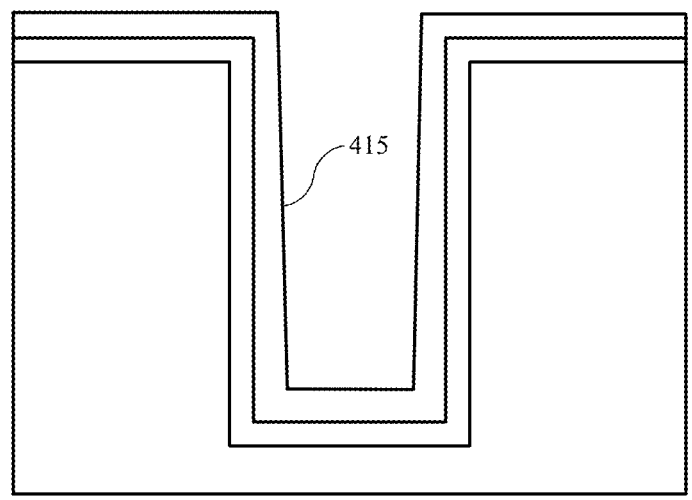

Operation 305 may be performed for a first period of time during which a first amount of plating may occur at operation 310. The first period of time may be any amount of time to produce sufficient coverage, and may be greater than or about 2 minutes, greater than or about 5 minutes, greater than or about 10 minutes, or more. The plating may be limited to less than or about 500 nm, and may be limited to less than or about 250 nm, less than or about 200 nm, less than or about 150 nm, less than or about 100 nm, or less, which may ensure sufficient coverage across all surfaces of the feature to be plated. It is to be understood that the operation time and coverage may vary depending on aspects of the feature and amount of buildup to be performed. Although the formation may be uniform, in some embodiments, because the process is performed in the plating bath, the coverage may preferentially occur in regions distal to the surface of the wafer, which may also be the issues insufficiently seeded previously. This may occur because suppressor additives may limit deposition at the neck of the feature, while accelerator additives may facilitate deposition further into the feature. Consequently, the operation may advantageously limit pinching at the neck of the feature or features to be filled. Hence, as shown in FIG. 4B, coverage may be increased along the base and corner regions of the feature, while controlling formation at an entry or neck of the feature.

After the pulsing operation has been completed, the power supply may be switched to a continuous DC current delivery at operation 315, which may occur for a second period of time during which a second amount of metal may be plated at operation 320. Accordingly, pulsing may no longer occur, but the average current density may be maintained or slightly increased, which may prevent excessive plate-out during the transition from pulsing to continuous operation. In some embodiments, the average current density during the second operation may be greater than or about the same as the average current density during the first period of time, such as during the pulsed operation. However, the peak current or peak current density may be maintained less than the peak current or peak current density during the first period of time. Thus, while the peak current may exceed 2 A, or more during the first period of time, the peak current may be maintained below or about 2 A during the second period of time, and may be maintained at less than or about 1.5 A during the second period of time, less than or about 1.0 A, less than or about 0.5 Å, or less. This may allow plating to be performed up through the feature uniformly, which may limit or prevent void formation.

The second period of time may also vary depending on aspects of the feature being filled, and in some embodiments the second period of time may be greater than the first period of time. Additionally, in some embodiments, the second period of time may include a number of sub-periods of time in which the current or average current density may be ramped as equilibrium is achieved in plating, and growth through the features may be increased as the feature is filled. For example, any number of ramping steps may be performed at optional operation 325, which may each increase average current density. Each period of time may be any of the time periods noted previously, and each time period may be the same or different in some embodiments. Similarly, the current increase may be a linear increase at each sub-period, or each increase may be more or less than any previous increase in current or current density. In some embodiments during each sub-period, the average current density may be equal to or greater than the average current density during the first period of time. Additionally, a peak current or peak current density may be less than the peak current or peak current density during the first period of time. By performing pulsed operations according to embodiments of the present technology, improved seed layer coverage may be ensured, which may improve via or feature fill operations while limiting or preventing void formation.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the wetting techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the period of time" includes reference to one or more periods of time and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of electroplating, the method comprising:
  delivering a current from a power supply through a plating bath of an electroplating chamber for a first period of time, wherein the current delivered comprises a pulsed current at a duty cycle of less than or about 50%;
  plating a first amount of metal on a substrate within the plating bath, wherein the substrate defines a via within the substrate;
  subsequent the first period of time, transitioning the power supply to a continuous DC current delivery for a second period of time; and plating a second amount of metal on the substrate,
wherein a peak current density during the first period of time is greater than a peak current density during the second period of time.

2. The method of electroplating of claim 1, wherein the current delivered during the first period of time is characterized by an operational frequency of less than or about 1,000 Hz.

3. The method of electroplating of claim 1, wherein an average current density during the first period of time is less than or about 3 mA/cm$^2$.

4. The method of electroplating of claim 3, wherein an average current density during the second period of time is greater than or equal to the average current density during the first period of time.

5. The method of electroplating of claim 4, wherein a peak current during the second period of time is less than or about 2 Amps.

6. The method of electroplating of claim 5, wherein a peak current during the first period of time is greater than or about 2 Amps.

7. The method of electroplating of claim 1, wherein, during the second period of time, average current density is increased over time.

8. The method of electroplating of claim 1, wherein the via defined within the substrate is characterized by a depth of greater than or about 10 μm.

9. The method of electroplating of claim 1, further comprising:
a barrier layer formed along walls of the via defined within the substrate.

10. The method of electroplating of claim 9, wherein the barrier layer comprises one or more of tantalum or titanium, and wherein the metal deposited comprises copper.

11. A method of electroplating, the method comprising:
delivering a current from a power supply through a plating bath of an electroplating chamber for a first period of time, wherein the power supply is operated during the first period of time in a pulsed DC delivery at a frequency of less than or about 750 Hz;
plating a first amount of copper on a substrate within the plating bath;
subsequent the first period of time, transitioning the power supply to a continuous DC current delivery for a second period of time; and
plating a second amount of copper on the substrate,
wherein a peak current density during the first period of time is greater than a peak current density during the second period of time.

12. The method of electroplating of claim 11, wherein an on-time during the first period of time for each pulse is less than or about 100 ms.

13. The method of electroplating of claim 11, wherein, during the first period of time, the power supply is operated at a duty cycle of less than or about 20%.

14. The method of electroplating of claim 11, wherein an average current density during the first period of time is less than an average current density during the second period of time.

15. The method of electroplating of claim 11, wherein the peak current density during the first period of time is greater than or about two times the peak current density during the second period of time.

16. The method of electroplating of claim 11, wherein the substrate defines a via characterized by a depth-to-width ratio greater than or about 10.

17. The method of electroplating of claim 11, wherein the via is lined with a barrier layer and a seed layer of copper.

18. The method of electroplating of claim 11, wherein, during the second period of time, average current density is ramped in a set of plating operations.

19. A method of electroplating, the method comprising:
delivering a current from a power supply through a plating bath of an electroplating chamber for a first period of time, wherein the power supply is operated during the first period of time in a pulsed DC delivery at a frequency of less than or about 1000 Hz at a duty cycle of less than or about 50%;
plating a first amount of copper on a substrate within the plating bath, wherein the substrate defines a via lined with a barrier layer and a seed layer of copper, and wherein the first amount of copper plated is characterized by a thickness of less than or about 500 nm;
subsequent the first period of time, transitioning the power supply to a continuous DC current delivery for a second period of time greater than the first period of time; and
plating a second amount of copper on the substrate,
wherein a peak current density during the first period of time is greater than a peak current density during the second period of time.

* * * * *